United States Patent [19]

Siegenthaler

[11] 4,240,031
[45] Dec. 16, 1980

[54] DEVICE FOR MEASURING THE POTENTIAL OF AN ALTERNATING CURRENT CARRYING INNER CONDUCTOR OF AN ENCASED HIGH-VOLTAGE SWITCHING MECHANISM

[75] Inventor: Andreas Siegenthaler, Monchaltorf, Switzerland

[73] Assignee: BBC Brown, Boveri & Company Limited, Baden, Switzerland

[21] Appl. No.: 15,646

[22] Filed: Feb. 27, 1979

[30] Foreign Application Priority Data

Mar. 23, 1978 [CH] Switzerland ........................ 3206/78

[51] Int. Cl.³ .............................................. G01R 15/04
[52] U.S. Cl. .................................................... 324/126
[58] Field of Search .................... 324/126, 127, 117 R

[56] References Cited

U.S. PATENT DOCUMENTS

| | | | |
|---|---|---|---|
| 3,932,810 | 1/1976 | Kohler et al. | 324/126 |
| 3,988,684 | 10/1976 | Muller et al. | 324/126 X |

FOREIGN PATENT DOCUMENTS 1058890  2/1967  United Kingdom .................... 324/126

*Primary Examiner*—Stanley T. Krawczewicz
*Attorney, Agent, or Firm*—Burns, Doane, Swecker & Mathis

[57] ABSTRACT

A device for measuring the electrical potential of the inner conductor in an encased high-voltage switching mechanism filled with a gaseous insulator includes an active, capacitive voltage divider. One capacitor of the voltage divider is located within the grounded metal casing of the switching mechanism and is connected with an input terminal of an amplifier. The amplifier is supplied with power from the inner conductor and has a feedback path including the second capacitor of the voltage divider. In order to accurately perform voltage measurements independent of the pressure and temperature of the insulator within the casing, the feedback capacitor is also installed inside the metal casing. This arrangement enables the ratio of the capacitances of the two capacitors, which determines the quality of the voltage measurement, to remain constant over a large pressure and temperature range.

9 Claims, 1 Drawing Figure

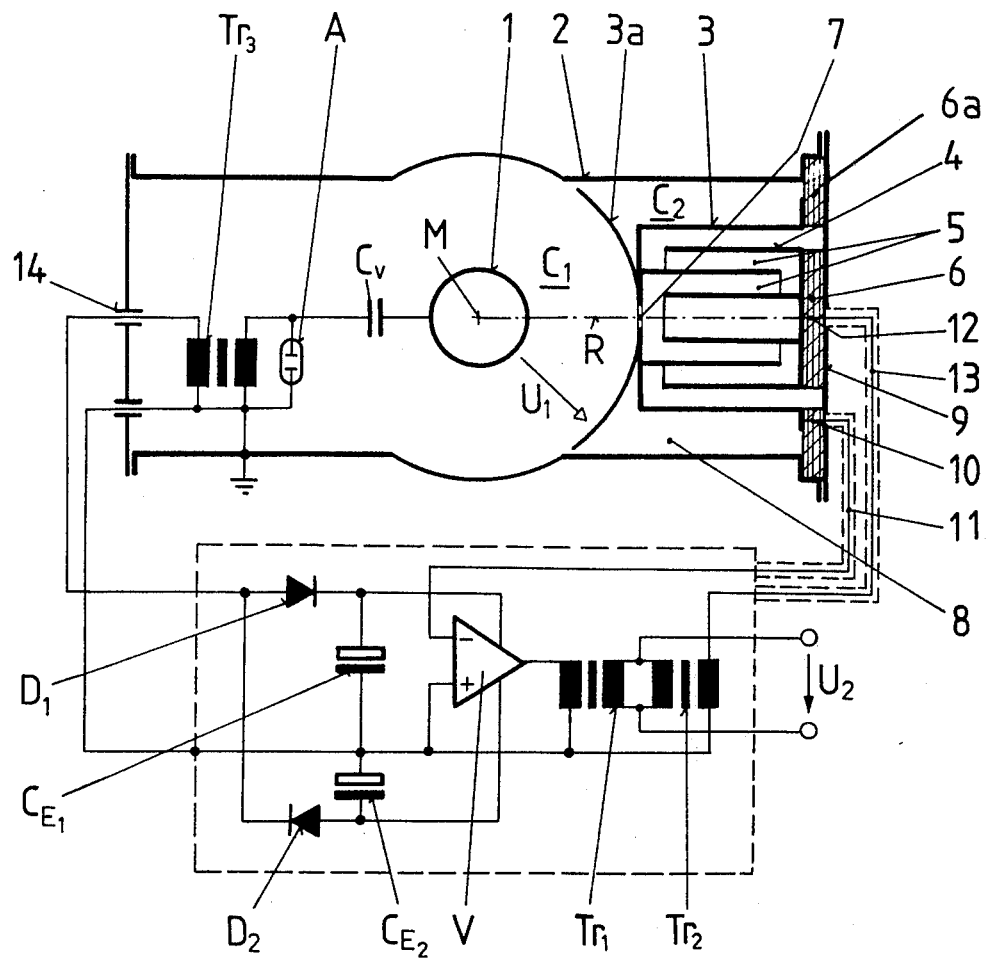

DEVICE FOR MEASURING THE POTENTIAL OF AN ALTERNATING CURRENT CARRYING INNER CONDUCTOR OF AN ENCASED HIGH-VOLTAGE SWITCHING MECHANISM

BACKGROUND OF THE INVENTION

The present invention relates to a device for measuring the electrical potential of the inner conductor in an encased high-voltage switching mechanism which is filled with a gaseous insulator.

A device of this type is disclosed in general in the article "The ESPOM, A Capacitor—Coupled Electronic Voltage Transformer" by M. Groenenboom and H. A. J. M. Spoorenberg, which appeared in the publication *Smit-Mededelingen* No. 4, 1969 of the Smit Nijmegen Electrotechnische Fabriken N.V. In the operation of this disclosed device, high-voltage and low-voltage capacitors operate as a voltage divider, and the voltage which is measured at the junction of the two capacitors is supplied through a test lead to an input terminal of an amplifier. The accuracy of the voltage measurement is largely dependent upon the stability of the ratio of the capacitances of the two capacitors to each other. The current delivered through the high-voltage capacitor is compensated for by the low-voltage capacitor which is connected as a feedback element of the amplifier so that the amplifier input voltage remains approximately at zero volts. Through this arrangement, a voltage measurement is obtained which is largely independent of stray, insulation and cable capacitances. However, the ratio of the capacitances is also a function of the pressure and temperature of the gaseous insulator so that considerable deviations of the measurement value from the true value can occur under some conditions.

OBJECTS AND BRIEF SUMMARY OF THE INVENTION

It is therefore an object of the present invention to provide a novel voltage measuring device in which the voltage measurement can be accurately carried out independently of the pressure and temperature of the gaseous insulator.

It is another object of the present invention to provide a novel voltage measurement device which can be operated without the need for an additional power supply network.

These as well as other objects and advantages are achieved in accordance with the present invention by placing the low-voltage capacitor within the gas filled casing of the switching mechanism. Since the two capacitors are installed in the same insulating material, the ratio of their capacitances to one another is independent of the pressure and temperature of the insulating material so that high accuracy in the measurement of the potential of the current-conducting inner conductor is obtained.

A simple and reliable design of the measuring device according to the present invention is obtained by providing a common electrode for the two capacitors.

A further simplification and therefore reduction in cost of the device according to the present invention is achieved by designing the two electrodes of the low-voltage capacitor as cylindrical plates which are coaxial with an axis perpendicular to the central axis of the inner conductor.

A large capacitance of the low-voltage capacitor is desirable for measurement accuracy, and can be obtained with minimum space requirement according to a further feature of the present invention by providing the two electrodes of the low-voltage capacitors as cylindrical plates of different diameters which are located one within the other.

Another advantage of the present invention is that it permits the high-voltage and low-voltage capacitors to be produced without narrow manufacturing tolerances since the ratio of their capacitances can be almost any random fixed value. After determining this value by calibration measurements, the transmission ratio of an adjustable transformer which supplies the low-voltage capacitor with feedback current is correspondingly adjusted to achieve the desired ratio. The operating voltage and capacitance of the low-voltage capacitor can therefore be optimally balanced with each other with respect to the production and insulation cost in the case of a practical design.

Furthermore, according to the present invention, the amplifier can be connected to the inner conductor to receive power through a second capacitor-transformer network so that the measuring device can be operated independently of any additional power supply network.

BRIEF DESCRIPTION OF THE DRAWING

The FIGURE is a sectional view through an inner conductor of an encased high-voltage switching mechanism illustrating a measuring device according to the present invention and includes a partial schematic circuit diagram of the amplifier and its power supply.

DETAILED DESCRIPTION

As illustrated in the FIGURE, an alternating current conducting inner conductor 1 is arranged in a metal casing 2 of a high-voltage switching mechanism. The casing 2 is filled with a gaseous insulating material such as $SF_6$, for example. The inner conductor 1 functions as the high-voltage electrode and a metal plate 3 is the test electrode of a high-voltage capacitor $C_1$. The gaseous insulator within the casing 2 serves as the dielectric material in the capacitor. If necessary, a cylinder segment 3a which partially encloses the inner conductor 1 can also form part of the test electrode of the high-voltage capacitor $C_1$. The test electrode 3 also forms one of the two electrodes 3, 4 of a low-voltage capacitor $C_2$. These two electrodes 3, 4 are preferably designed as cylindrical plates which are symmetrical about a rotational axis R perpendicular to the center axis M of the inner conductor 1. In a preferred embodiment of the invention, each electrode 3, 4 has two cylindrical plates with different diameters which face one another. These plates form closed ring-shaped recesses between the surfaces of the plates which face one another, such as illustrated at 5 in the FIGURE, so that the electrode 4 with the smaller diameter can be slipped without contact into the recess formed by the cylindrical plates of the larger diameter electrode 3. The plates 3, 4 are held in place by two separate insulators 6, 6a respectively, which are supported on a grounded casing plate 9. There is an opening 7 in the electrode plate 3 with the larger diameter through which the gaseous insulating material can enter into the space 5 between the two electrode plates 3, 4. Both electrode plates 3, 4 are arranged in a branch pipe 8 of the metal casing 2. The insulator 6a which is attached to the metal plate 9 of the metal casing forms an annular flange which closes off the end of the branch pipe. The larger electrode 3 of the two electrodes of the low-voltage capacitor $C_2$ is connected through a lead 10 and a shielded test cable 11 with the inverting input terminal of a preamplifier V. The smaller electrode 4 of the two electrodes of this capacitor is connected through a lead 12 and a shielded cable 13 with the secondary winding of an adjustable step-up transformer $Tr_2$ whose primary winding is connected to the output terminal of the preamplifier V through an ungrounded transformer $Tr_1$.

The two capacitors $C_1$ and $C_2$ form an active capacitive voltage divider. The current delivered from the high-voltage capacitor $C_1$ to the amplifier is compensated for by the low-voltage capacitor $C_2$ in the feedback path of the amplifier so that the amplifier input voltage is essentially zero. After amplification of the input signal in the preamplifier V, a test voltage $U_2$ appears across the secondary winding of the ungrounded transformer $Tr_1$. The test voltage $U_2$ is approximately equal to $C1/C2$ times the voltage $U_1$ across the high-voltage capacitor $C_1$, wherein C1 and C2 represent the capacitance of the high-voltage and low-voltage capacitors $C_1$ and $C_2$, respectively. Stray and test cable capacitances do not affect the test result due to the negative feedback in the amplifier. In view of the separation of the insulators 6 and 6a which support the electrodes 3, 4 all stray conduction paths from electrode to electrode are substantially eliminated and the dielectric element of both test capacitors $C_1$, $C_2$ consists almost exclusively of gaseous paths. A change in the pressure and temperature of the gaseous insulating material will not effect the transformation ratio $C2/C1$ of the measurement device, and hence the test result will be stable since the capacitances are determined by the dimensions of the gaseous paths. The geometrical dimensions of the gaseous paths remain practically constant for temperature and pressure changes of the insulating material and the change of the dielectric constants of the insulating material is the same in both capacitors so that the transformation ratio remains constant.

A reduction of the transformation ratio $C2/C1$ to provide a mechanically simple design of the low-voltage capacitor $C_2$ without requiring precise processing tolerances is achieved through use of the step-up transformer $Tr_2$ which receives the output signal from the ungrounded transformer $Tr_1$ and supplies the capacitor $C_2$ with a voltage which is stepped up a number of times, for example tenfold, with respect to the test voltage $U_2$. It is especially advantageous to have the winding ratio of the transformer $Tr_2$ to adjustable over a continuous range since this feature makes it possible to select a desired transformation ratio $C2/C1$ and thereafter adjust the transformer $Tr_2$ so that the output voltage $U_2$ corresponds to a specified transformation ratio regardless of the actual capacitance of the low voltage capacitor $C_2$.

The power supply for the amplifier containing the preamplifier V and the two transformers $Tr_1$ and $Tr_2$ can be provided through a further high-voltage capacitor $C_V$ located within the metal casing 2 and having one electrode coupled to the inner conductor 1. A transformer $Tr_3$ having a transformation ratio greater than one and also located within the casing 2 has its primary winding connected with the other electrode of the high-voltage capacitor $C_V$. A rectifier circuit located outside of the casing 2 is connected through a lead 14 with a secondary winding of the transformer $Tr_3$. The transformer $Tr_3$ is protected from high voltages by a voltage limiting device A, such as a Zener diode, a glow-discharge lamp or a varistor. The rectifier circuit includes two diodes $D_1$ and $D_2$ which are connected as a full wave rectifier circuit and enables a directional charging of two series connected electrolytic capacitors $C_{E1}$ and $C_{E2}$.

It is preferable to house the high-voltage part of the power supply circuit for the amplifier in one chamber and the low-voltage capacitor $C_2$ in the opposite chamber of a crosspiece portion of the metal casing 2 of the high-voltage switching mechanism. The power supply circuit can also be installed in a further branch pipe of the metal casing 2 so that two measuring points can be housed in both chambers of the crosspiece by providing two low-voltage capacitors $C_2$.

In order to maintain output test voltages $U_2$ of approximately 100 V with a 20–30 VA signal in a 220 KV system, the following values have been found to be desirable in one embodiment of a measuring device constructed according to the present invention:

Transformation ratio of capacitances $C2/C1$:$2.10^2$
Windings ratio of transformer $Tr_2$:1:10
Capacitance of the capacitor $C_V$:0.2–2nF
Transformation ratio of transformer $Tr_3$:100:1 ... 1000:1

The present invention may be embodied in other specific forms without departing from the spirit or essential characteristics thereof. The presently disclosed embodiment is therefore considered in all respects as illustrative and not restrictive. The scope of the invention is indicated by the appended claims rather than the foregoing description, and all changes which come within the meaning and range of equivalency of the claims are therefore intended to be embraced therein.

What is claimed is:

1. A device for measuring the electrical potential of an inner conductor of a high-voltage switching mechanism having a grounded metal casing which is filled with an insulating material, comprising:
   a first capacitor located within the insulator filled casing including a high voltage electrode comprised of said inner conductor and a test electrode;
   an amplifier having an input terminal connected to said test electrode; and
   a second capacitor located within said insulator filled casing which is connected to said first capacitor and coupled to said amplifier in a feedback path.

2. The measuring device of claim 1 wherein one of the electrodes of said second capacitor is the test electrode of said first capacitor.

3. The measuring device of claim 2 wherein the electrodes of said second capacitor are symmetrical about an axis of rotation which is perpendicular to a central axis of said inner conductor.

4. The measuring device of claim 3 wherein the electrodes of said second capacitor include two cylindrical plates having different diameters and forming recesses such that the electrode plate of smaller diameter can be placed within the electrode plate of larger diameter without contacting said larger diameter electrode plate.

5. The measuring device of claim 4 wherein each of said two plates is supported by an insulator and wherein said larger diameter plate has an opening which permits insulating material to enter the recesses formed between said two plates.

6. The measuring device of claim 5 wherein said metal casing includes a branch pipe in which said two electrode plates are housed and further wherein the insulator which supports said larger diameter plate is annular in shape and forms a flange at an end of said branch pipe.

7. The measuring device of claim 2, 3, 4, 5 or 6 further including an adjustable transformer having a primary winding connected to an output terminal of said amplifier and a secondary winding connected to the other electrode of said second capacitor.

8. The measuring device of claim 7 further including means for supplying power to said amplifier comprising:

a third capacitor having one electrode connected to said inner conductor;
a step-up transformer having a primary winding connected to the other electrode of said third capacitor; and
a rectifier circuit connecting a secondary winding of said step-up transformer to said amplifier.

9. The measuring device of claim 8 further including a voltage limiting circuit element connected to the primary winding of said step-up transformer, further wherein said rectifier circuit includes two electrolytic capacitors and a pair of diodes connected so as to provide charging of said capacitors in one direction only.

* * * * *